(12) United States Patent
Cerio

(10) Patent No.: US 6,264,773 B1
(45) Date of Patent: Jul. 24, 2001

(54) APPARATUS AND METHOD FOR TEMPORARY AND PERMANENT ATTACHMENT OF PELLICLE FRAME TO PHOTOMASK SUBSTRATE

(76) Inventor: Mark Damian Cerio, 3513 Ashmere Loop, Round Rock, TX (US) 78681

( * ) Notice: Subject to any disclaimer, the term of this patent is extended or adjusted under 35 U.S.C. 154(b) by 0 days.

(21) Appl. No.: 09/144,810

(22) Filed: Sep. 1, 1998

(51) Int. Cl.[7] ................................................. B32B 31/14
(52) U.S. Cl. ..................... 156/64; 156/152; 156/275.5; 428/14
(58) Field of Search .................... 156/64, 152, 247, 156/299, 307.1, 344, 272.2, 273.3, 273.5, 275.5, 379.6, 378, 584, 94; 428/14

(56) References Cited

U.S. PATENT DOCUMENTS 5,261,156 * 11/1993 Mase et al. ........................... 29/832
5,888,327 * 3/1999 Akagawa et al. ..................... 156/64

* cited by examiner

Primary Examiner—Michael W. Ball
Assistant Examiner—John T. Haran
(74) Attorney, Agent, or Firm—Rick B. Yeager

(57) ABSTRACT

An improvement is proposed in the design and manufacturing of the frame-supported pellicle used to protect the photomask- a lithographic template employed in semiconductor manufacturing for creating integrated circuit devices- from airborne contaminants. Addressed, is that the industry's current pellicle frame design always results in the destruction of the frame-supported pellicle and sometimes the photomask itself when- as is frequently the case- defects are found underneath the frame-supported pellicle necessitating its removal to permit photomask repair and/or cleaning. In addition, imperfections in the flatness of the current pellicle frame induce physical distortions in the photomask that result in degradations to the photomask's pattern placement accuracy. In this invention, a novel pellicle frame design is proposed that employs a two-step bonding process to allow the removal of the frame-supported pellicle without any damage to itself or the underlying photomask such that corrections for defects or contamination can be implement and the original pellicle re-applied. Furthermore, the invention proposes a manufacturing strategy that improves the flatness characteristics of the pellicle frame such that no distortions or corresponding pattern placement errors are induced in the photomask.

7 Claims, 10 Drawing Sheets

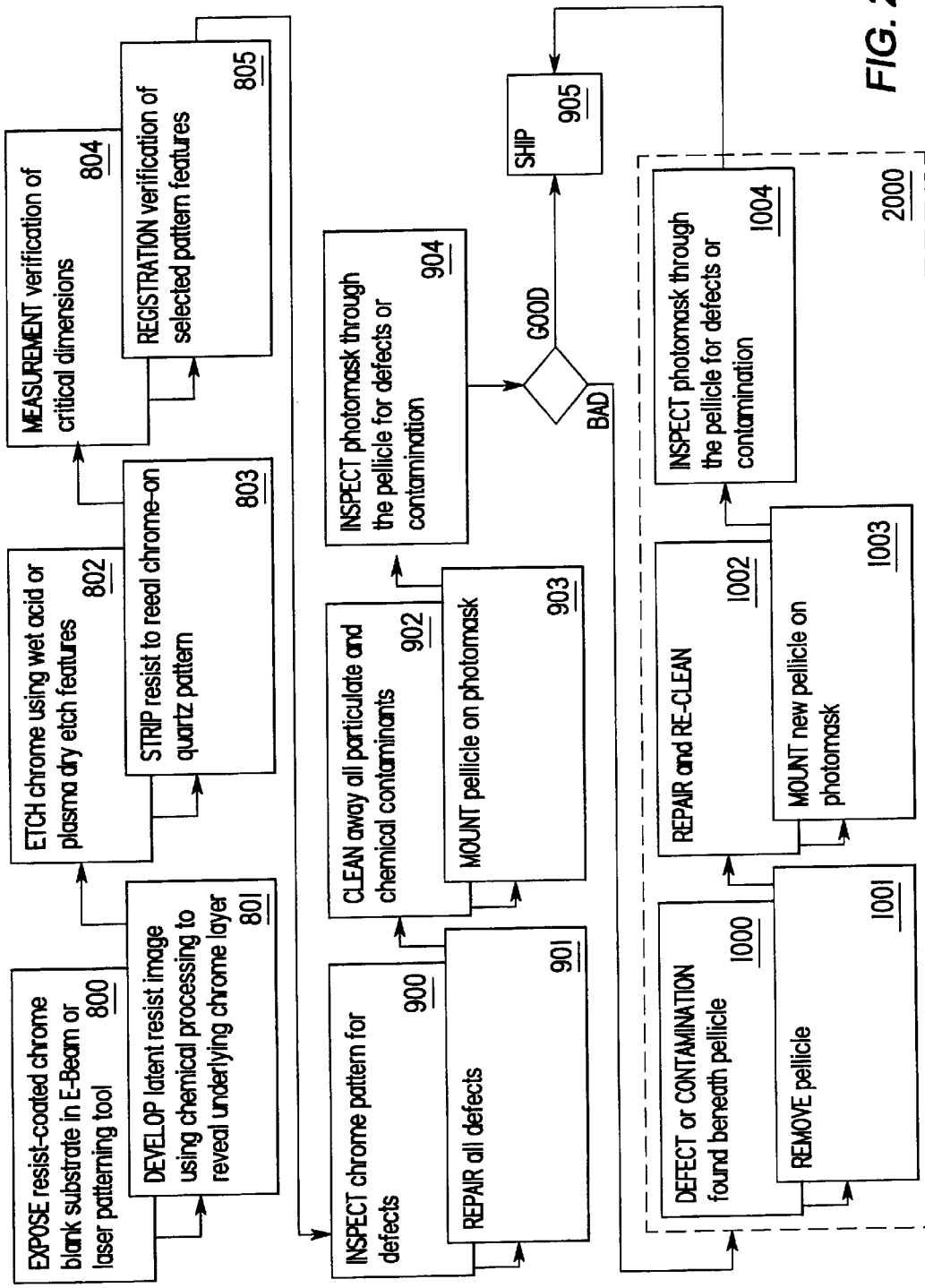

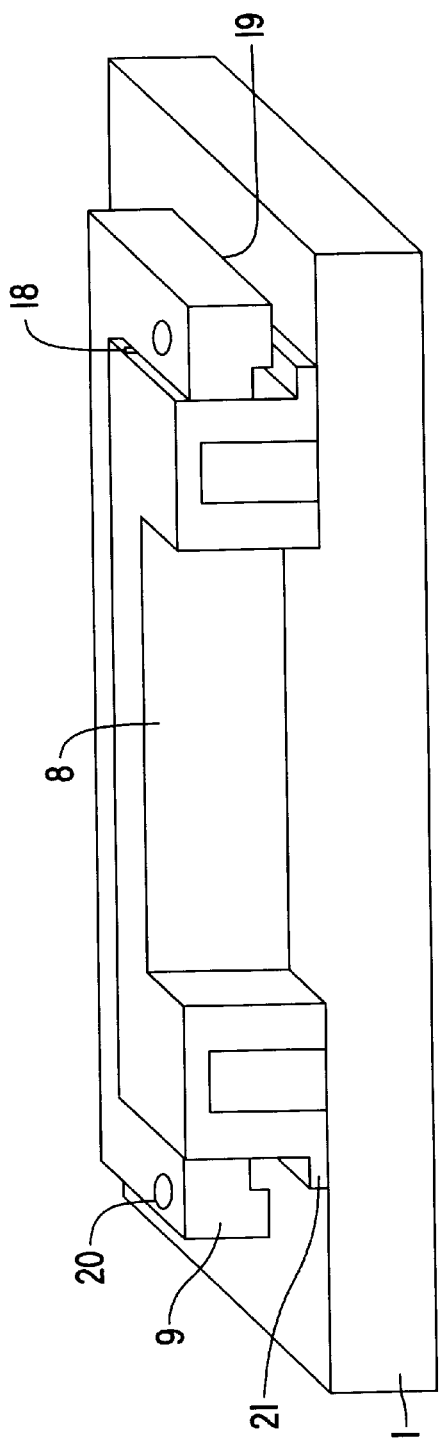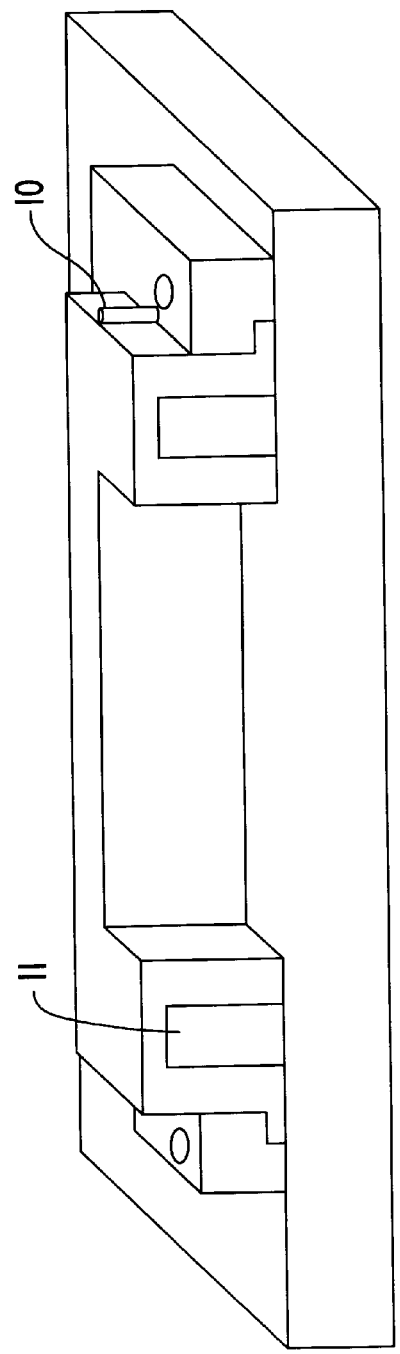
FIG. 4A
FIG. 4B

APPARATUS AND METHOD FOR TEMPORARY AND PERMANENT ATTACHMENT OF PELLICLE FRAME TO PHOTOMASK SUBSTRATE

BACKGROUND OF THE INVENTION

Photomasks are chrome patterned quartz templates (Refer to FIG. 1) employed in a photolithographic process (sometimes referred to as photoengraving) for transferring the integrated circuit designer's ideas onto silicon substrates. An integrated circuit is manufactured by succession transfers of unique photomask layers composing a device set of 15 to 25 layers onto silicon wafers coated with a photoactive polymer called a resist. The pattern transfer is accomplished using ultraviolet (UV: 365 nanometers) or deep-ultraviolet (DUV: 248 nanometers) exposure tools called wafer steppers that optically reduce the photomask image by factor of 4× or 5× its original size. As the wafer stepper exposes the silicon wafer, the stage of the wafer stepper moves in precise incremental steps to create a 2-dimensional matrix of identical patterns on the coated silicon wafer. The minute features represented in the resist define the areas for doping or interconnection and will ultimately constitute the functional elements (i.e., sources, drains, and gates) that make up the integrated circuit device. When the wafer manufacturing process is complete, the matrix of identical patterns will be cut into separate elements each yielding an integrated circuit chip.

Manufacturing specifications for photomasks are very tight with regards to critical dimension control (feature size), pattern placement (registration), hard defects (pattern errors) and contamination (soft defects), as any imperfections in the photomask will be replicated many times in the silicon and adversely impact the functional integrity of the resulting integrated circuits. Accordingly, photomask manufacturers invest considerable time in verification of product quality using an extensive line of sophisticated measurement and automated inspection tools. In additional, a safeguard is taken to ensure that when the product is shipped and throughout its lifetime of use by the IC manufacturer it is protected from the deposition of airborne contaminants. Referring again to FIG. 1, a dust cover called a frame-supported pellicle (pellicle) is mounted on the photomask (1). The frame-supported pellicle (2) is a transparent polymeric membrane (pellicle membrane) bonded in a taut drum-like manner to a rigid aluminum frame (3), also known as a pellicle-frame. The opposing side of the pellicle-frame, bonded to the photomask surface, is coated with a pressure-sensitive adhesive (4). The mounted frame-supported pellicle enshrouds and protects the important pattern data (5) of the photomask from the deposition of airbourne contaminants (6) yet is transparent to the actinic radiation of the wafer stepper tool. The pellicle frame height is an important functional element of the frame-supported pellicle. Its dimension is established such that any contaminants (7) falling on the pellicle membrane are out of the focal plane of the wafer stepper tool and unable to image on the resist coated silicon wafer. Each brand and model of wafer stepper has its own specifications for pellicle-frame height and size. The length and width of frame-supported pellicles vary based on the size of the stepper's exposure quality area, the size of the photomask substrate, and the amount of pattern area. In short, there is not one frame-supported pellicle size but rather an assortment of sizes. Regardless of size or type, all pellicles perform the same basic functional purpose of protecting the photomask from contamination.

Referring now to FIG. 2, is a summary of the photomask manufacturing process. As shown, frame-supported pellicle mounting (904) is one of the final steps in the photomask manufacturing process (800–905). It occurs, only after it has been verified that the photomask meets its specifications for critical dimension control (804), pattern placement accuracy (805), and is free of hard defects and contamination (900–902). Once the frame-supported pellicle has been mounted on the photomask, one final "through-the-pellicle" (through-pellicle) inspection (904) is performed to verify that no hard defects or contamination have been added to the photomask since the time of its last "pre-pellicle" inspection (900). If and only if, the photomask passes its through-pellicle inspection, can it then be shipped to the customer or used internally for IC manufacturing. It is also assumed, although not verified, that the mounted frame-supported pellicle has no distorting affect upon the photomask substrate that will compromise the accuracy of its pattern placement (registration).

In actuality the photomask frequently fails its final "through-pellicle inspection (904), an event that given the prior art of pellicle frame design results in the destructive removal of the frame-supported pellicle (1001) and sometimes destroys the photomask, itself. Furthermore, photomask distortions have been directly correlated to the application of the prior art's pellicle frame and have been measured as pattern placement errors.

The yield of the pellicle mounting process is defined as the percentage of photomasks which, though passing their pre-pellicle inspection, ultimately fail their final "through-pellicle" inspection and thereby require the removal of the frame-supported pellicle. The pellicle process is arguably the lowest yielding area in the photomask manufacturing process. Pellicle yields are frequently as low as 70% for tight specification product. The causes of yield loss are multifarious. Some of the most prevalent causes include: the automated inspection equipment is not 100% accurate. Defects or contamination can be missed during the pre-pellicle inspection that are latter captured during the final through-pellicle inspection. This is particularly prevalent when the photomask has a defect size specification approaching the limit of the detection capability of the inspection tool. Defects found during the pre-pellicle inspection may be inadequately repaired and later found during the final through-pellicle inspection. Defect inspection, contamination inspection, and pellicle mounting often take place in separate cleanroom bays by different production personnel. The considerable handling and transportation of the photomask risks the introduction of contaminants or damage to the product from scratches. The contamination inspection immediately preceding the pellicle mount process is always a blind process. There is no way of knowing if the photomask is free of contaminants until after its "through-pellicle" inspection since a post-clean pre-pellicle inspections itself risks introducing additional contamination. The pellicle mounting process is a labor-intensive manual operation very prone to the introduction of contaminants and susceptible to damaging the photomask and pellicle. What's more, the manual nature of the pellicle mount process is dependent on the skill of the pellicle mount operator and can vary dramatically from individual to individual. Furthermore, as photomasks specifications continue to tighten with regard to defects and contamination, these problems are sure to be exacerbated.

In the prior art of pellicle frame design, the frame-supported pellicle is permanently bonded to the photomask after its "pre-pellicle" inspection without any assurance it will pass its final "through-pellicle" inspection. This is a major flaw in the design of the pellicle process that has considerable logistical and financial consequences. When defects or contamination are found underneath the pellicle, the pellicle must be removed from the photomask to allow for the repair of those defects or the removal of that contamination (2000). In the prior art, pellicle removal is an aggressive process. The pressure sensitive adhesive is so tenacious that the pellicle must be mechanically pried from the from the photomask surface in a manner that is in striking contrast to the delicate handling employed in every other step of the photomask manufacturing process. The removal process always results in the destruction of the pellicle. Pellicles can cost more than $400 a piece. As the industry moves toward larger and larger substrates (preparations are underway for introducing 8" or 9" photomasks) pellicle sizes will increase accordingly with a corresponding increase in cost. Simultaneously, the wafer industry is moving towards E-line ultra-violet (EUV: 193 nanometers) wafer exposure tools that will require pellicles with advanced polymeric membranes transmissive at these wavelengths. The combination of increasing size and more advanced pellicle membrane technology will appreciably increase the cost of pellicles and the financial loss associated with the prior art's re-pelliclization process.

Another tremendous disadvantage of the prior art is the risk pellicle removal process poses to the photomask itself Once the pellicle has been dismounted from the photomask the photomask must be cleansed of any residual adhesive left behind by the frame. This process entails its own inherent risks. The additionally handling can result in catastrophic errors such as breakage or scratches on the photomask. The cleaning process used to remove the adhesive may cause damage to the minute features on the photomask or introduce unknown contaminants that cannot be removed. The financial loss of rejecting the photomask is considerable. The cost of a 6"×6"×0.250" photomask can range from $4000 for a binary photomask to $20,000 for a "state-of-the-art" phase-shift photomask. As in the case with pellicles, the cost of photomasks will increase enormously when 8" or 9" substrates are introduced and thus, the financial liability of the prior art' pellicle process.

An additional matter that compounds the risks of pellicle removal is that there are no assurances that with a second round of pellicle application the photomask will pass its final "through-pellicle" inspection. In fact, often the cycle of pellicle removal and reattachment must be performed several times before the photomask passes or is destroyed in the process. A simple probability calculation shows that if the pellicle yield were 80%, there yet remains a 6.4% chance that the second pellicle will also have to be removed and the entire process begun again. Every such cycle consumes expensive pellicles and endangers the underlying photomask.

In the preferred embodiment, the proposed invention employs a novel frame design that permits a two-step process for affixing the pellicle to the photomask surface. In the first step, the pellicle is temporarily affixed to the photomask using a vacuum bonding frame. The vacuum bonded pellicle is sufficient to enshroud and protect the photomask throughout its final "through-pellicle" inspection process. In the event that defects are found during the "through-pellicle" inspection, the pellicle can be removed without any damage to itself, the underlying photomask, or requiring any post-processing of the photomask. If and only if, the final inspection verifies the photomask is defect and contamination free, is the pellicle permanently bonded to the photomask using an adhesive coated locking ring assembly.

The photomask quartz substrate has the characteristics of extremely low thermal expansion, great mechanical rigidity, and flatness specifications of between 0.5 and 2.0 microns with a very high surface polish. These characteristics are basic functional requirements necessary to limit mechanical distortions in the photomask that could result in pattern placement errors or surface flaws that could degrade resist coating and pattern imaging. In the prior art, the pellicle frame is manufactured in a manner that is inconsistent with the above requirements and has been observed to induce distortions in the pellicle mounted photomask. The pellicle frame is currently composed of anodized aluminum manufactured using a mechanical milling process. In the course of machining, internal stresses are released in the material that result in physical distortions of the frame. An attempt is made by the pellicle frame manufacturer to limit these distortions by machining the frame from a single block of material and employing intermediate metal relaxation methods. Although some improvement is achieved, it is limited and accomplished at the expense of considerable waist of the constituent material. In addition, very little, if any, mechanical lapping is used to improve the quality of the pellicle frame's mounting service. As a result, photomask distortions have been directly correlated to the application of the pellicle frame and have been measured as pattern placement errors using registration tools such as the Leitz LMS 2000. The distortions are particularly apparent on photomasks of size 5"×5"×0.090" and less so, but still observable on 6"×6"×0.250" material.

In the preferred embodiment, this invention eliminates the distortion and improves the flatness of the pellicle frame by replacing aluminum as the constituent material with a polymer that is compatible with an injection molding process. A judiciously selected semi-crystaline polymer such as Polyetheretherkeytone (PEEK) can provide excellent mechanical properties such as stiffness, dimensional stability, chemical resistance, a variety of surface finishes together with superior processing characteristics. As will be discussed in the preferred embodiment of this invention, the injection molding process will allow greater flatness to be achieved in the pellicle frame reducing distortion of the underlying photomask and eliminating pattern placement errors.

SUMMARY OF THE INVENTION

The present invention has two fundamental objectives.

First, to provide a pellicle frame design that will permit the removal of the frame-supported pellicle without any damage to itself, the underlying photomask or requiring any post-processing of the photomask such that the necessary corrections for defects or contamination can be implement and the original pellicle re-applied. In the preferred embodiment of this invention, this objective is achieved by employing a novel frame design that permits temporary bonding of the frame-supported pellicle to the photomask using a vacuum and later permanently bonding the frame to the photomask using a secondary locking ring assembly employing a pressure sensitive adhesive.

Second, to eliminate pattern placement errors in the photomask induced by the physical distortions and/or imperfections in flatness of the mounted pellicle frame. In the preferred embodiment of this invention this objective will be accomplished by replacing the current pellicle frame material with a polymer compatible with an injection molding process.

BRIEF DESCRIPTION OF THE DRAWINGS

FIG. 1 is a 3-dimensional view of a photomask with a chrome-side mounted pellicle.

FIG. 2 is a flowchart of a portion of the photomask manufacturing process. The chart shows the major functional elements of the manufacturing process (800–904) as well as an optional process (2000) that must be used if defects or contaminants are found underneath the pellicle during final inspection of the photomask.

FIG. 4 is a 3-dimensional cross-sectional view of the fully assembled invention including the vacuum bonding frame and the surrounding locking ring assembly. FIG. 4A shows the locking ring assembling in the "unlock" position. FIG. 4B shows the invention in the final "locked" position.

FIG. 5 shows top-down views of the underside of the vacuum bonding pellicle frame and the locking ring assembly.

FIG. 8 shows 3-dimensional cross-sectional views of alternative embodiments of the pellicle frame design.

FIG. 9 is a top-down view of alternative embodiments of the mounting surfaced of the vacuum bonding frame.

DETAILED DESCRIPTION OF THE PREFERRED EMBODIMENT

The first improvement according to the present invention is to create a pellicle frame design that will permit the removal of the frame-supported pellicle from the photomask without damage to itself, the underlying photomask, or require any post-processing of the photomask such that corrections for defects or contamination can be implement and the original frame-supported pellicle re-applied. Thus, one goal of the invention is to preserve the expensive frame-supported pellicle for future remounting and to protect the even more expensive photomask from the potential damage that may result from frame-supported pellicle removal and/or post-processing (e,g., adhesive removal).

Figures 1A, 1B:
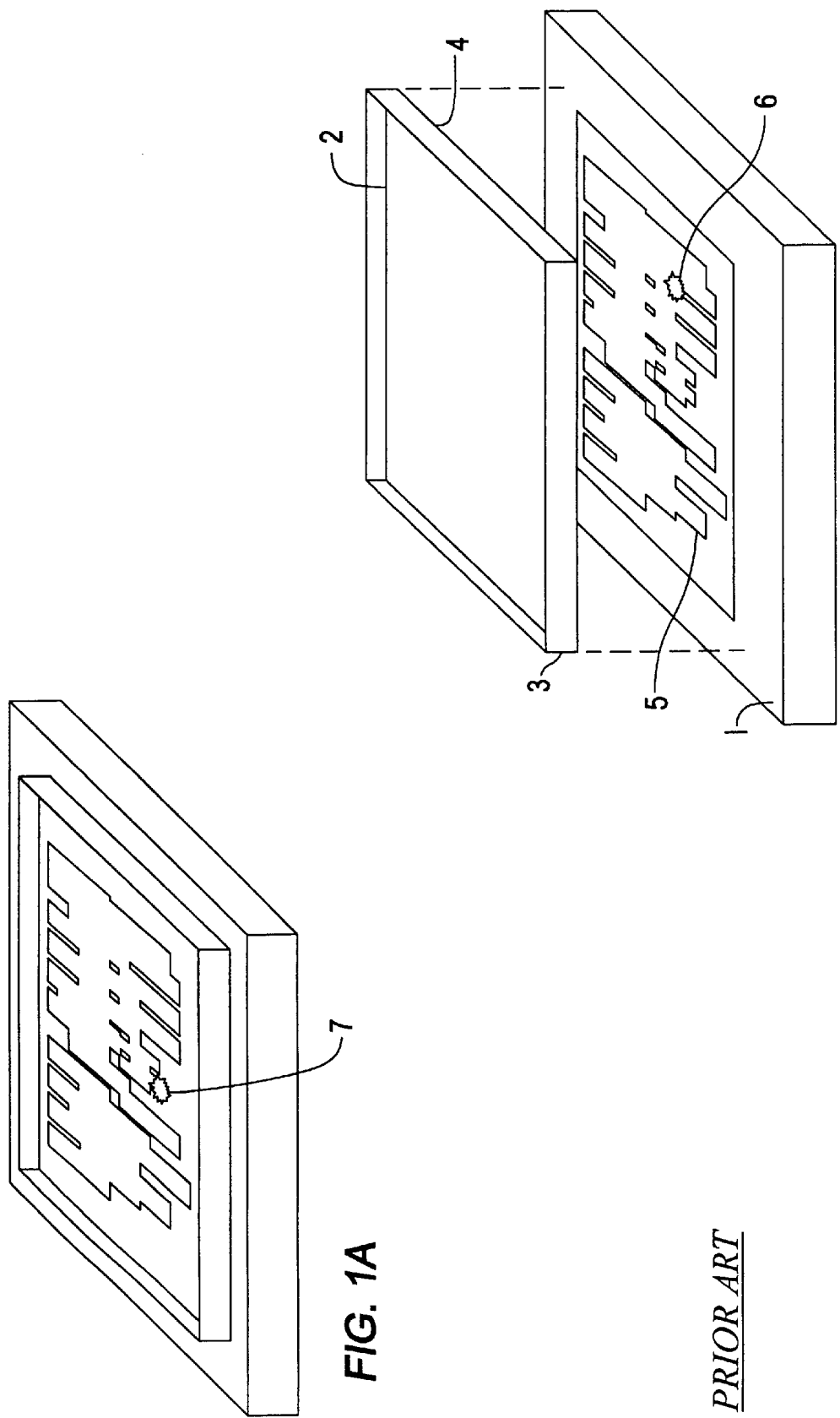
FIG. 1A shows how the frame supported pellicle membrane protects the patterned area of the photomask from particles.
FIG. 1B shows how the frame-supported pellicle is a separate unit from the photomask bonded to the photomask using an adhesive coated on the underside of the frame.
Figure 3:
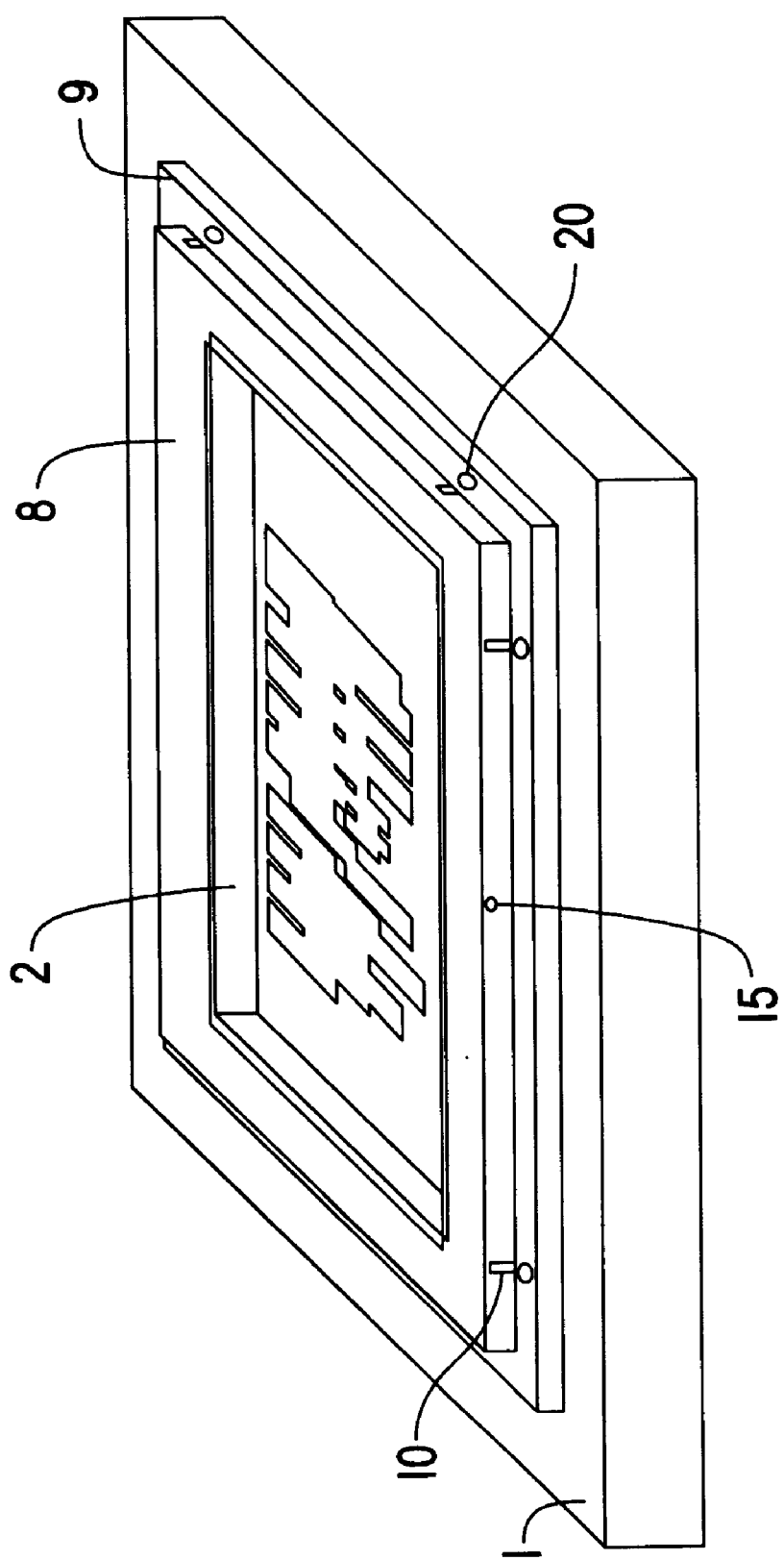
FIG. 3 is a 3-dimensional view of the new pellicle frame mounted on the photomask surface. The figure shows the frame-within-a-frame design consisting of the vacuum bonding frame (8) and the locking ring assembly (9) in the final locked position.

This objective is achieved by employing a novel pellicle frame design that permits a two-step process for bonding the frame-supported pellicle to the photomask surface. Referring now to FIG. 3, the new pellicle frame is composed of two separate yet contiguous components: a vacuum bonding frame (8) and a locking ring assembly (9). The vacuum-bonding frame is the inner frame of this "frame-within-a-frame" design that is used as the supporting structure of the pellicle membrane. The pellicle membrane is adhered to the vacuum-bonding frame using an adhesive in the same manner as is used in the prior art. The locking ring assemble is fitted around the exterior of the vacuum bonding frame on a tracked slide (10). The locking ring assembling is never in contact with the pellicle membrane.

Figure 5B:
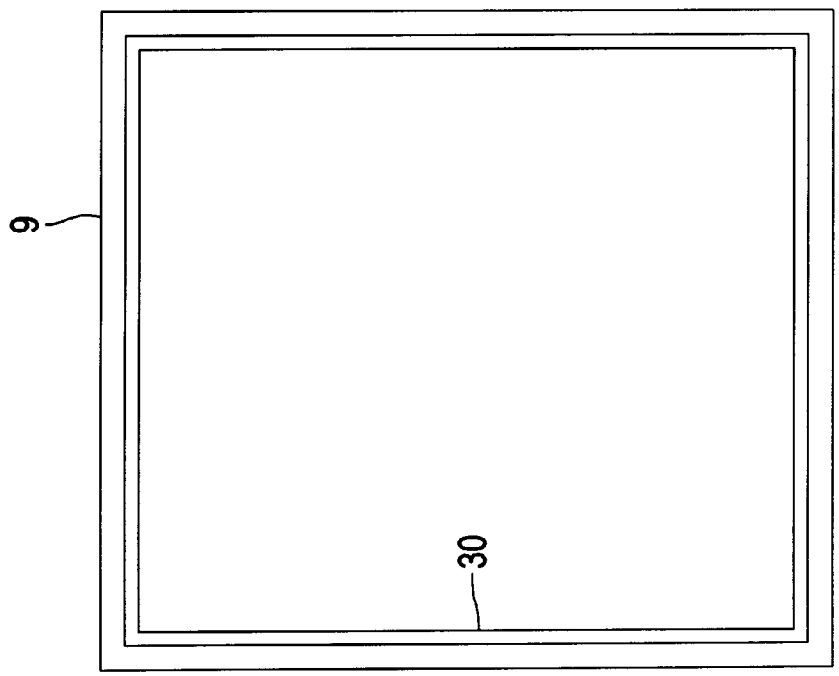
FIG. 5B shows the locking ring assembly (9) and its inner "cut-out" (30) used to bond it to the extruded lip (21) of the vacuum-bonding frame.
Figure 5A:
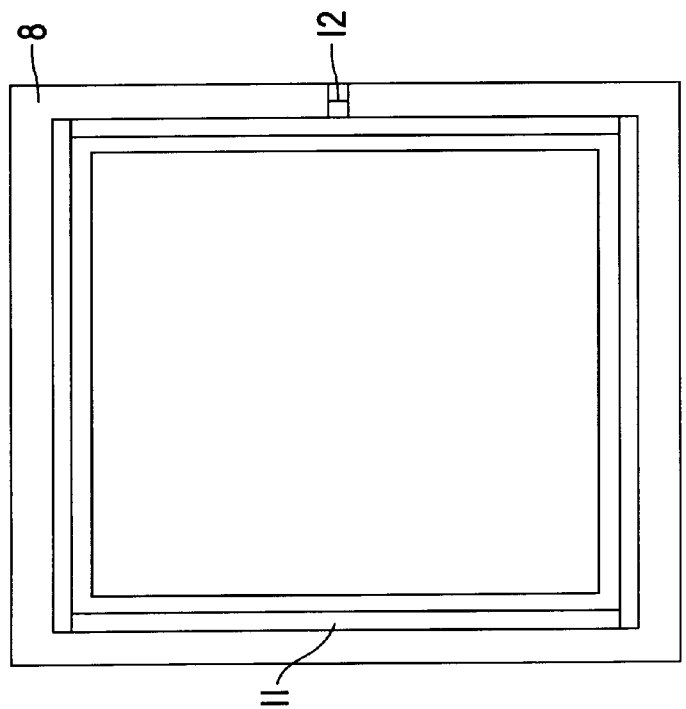
FIG. 5A shows the vacuum-bonding frame (8) and the position of the single continuous vacuum channel (11) and self-locking vacuum inlet valve (12).

Referring now to FIG 4A, in the first step of the pellicle mounting process, the frame-supported pellicle is temporarily bonded to the photomask using only the vacuum bonding frame (8). The locking ring assembly (9) is left in its "upward" position and not in contact with the photomask surface. The photomask substrate has characteristics that make it ideal for a vacuum bonding approach. The photomask is composed of quartz material polished to a flatness of 0.5 to 2 microns. It is also thoroughly cleaned of particulate or chemical contaminants that could otherwise compromise its lithographic performance. The substrate is extremely rigid, as a basic functional requirement, since any physical distortions resident in the photomask at the time of its use, such as gravitational sag, would result in positional displacements of the imprinted features on the wafer substrate. Thus, the photomask surface provides an extremely flat, clean, and mechanical rigid surface on which to apply a vacuum. The thickness of the vacuum bonding frame is approximately 0.1875 inches. Its height is dependent on the wafer stepper used for pattern transfer but is usually around 0.22 inches. The thickness of the locking ring assembly is approximately 0.094 inches with a height of approximately 0.1875 inches. Referring now to FIG. 5, the length and width of the vacuum bonding frame and associated locking ring assembly can vary considerably depending on the wafer exposure tool and the size of the photomask substrate. However, for a 6×0.250 inches photomask, typical external dimensions for the vacuum-bonding frame are 4.875 inches wide and 5.688 inches long. The corresponding external dimensions for the matching locking ring assembly are 5.063 inches wide and 5.688 inches long.

Figure 6B:
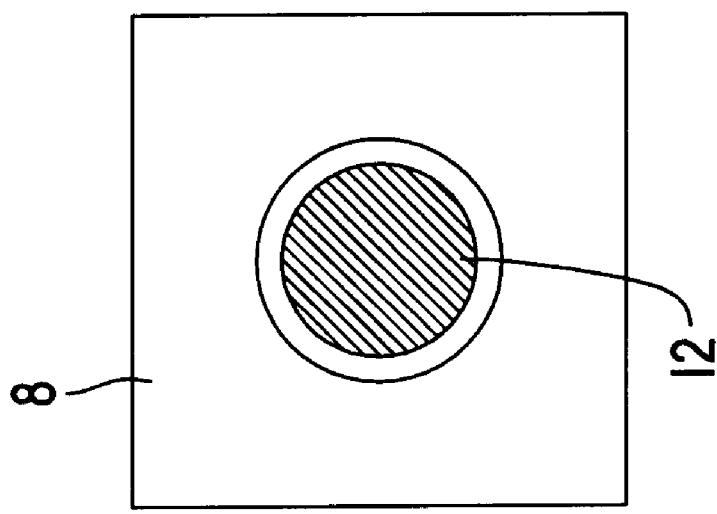
FIG. 6 is a side view (6A) and front view (6B) of the self-locking vacuum inlet valve (12). The figures show the positioning of the elastomer valve inside the body of the vacuum- bonding frame (8).
Figure 6A:
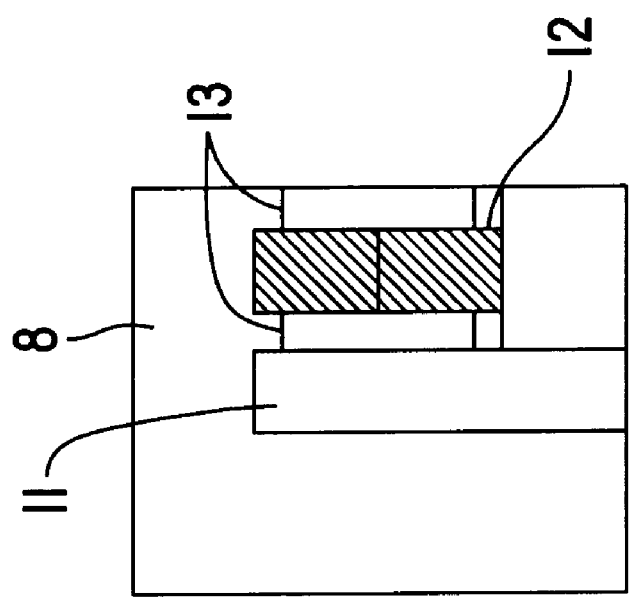

The vacuum-bonding frame achieves vacuum adhesion to the photomask by having its mounting surface manufactured to flatness specifications and a surface finish comparable to that of the photomask surface. Although laboratory tests have demonstrated that these characteristics alone would be sufficient to create a vacuum seal, additional bonding strength is achieved by incorporating a small vacuum channel into the bulk material on the mounting side of the vacuum-bonding frame. The vacuum channel (11) is a single continuous channel approximately 0.031 inches wide that runs the entire internal perimeter of the vacuum-bonding frame (8). A self-locking inlet valve (12) is connected to the vacuum channel. Referring now to FIG. 6, the self-locking inlet valve (15) is a basketball type valve composed of an elastomer. The elastomer valve is compressed from its relaxed dimension and inserted into an orifice manufactured into the wall of the vacuum-bonding frame. The vacuum channel is evacuated by puncturing the elastomer valve with a hollowed syringe connected to the house vacuum supply. Flanges (13) in the wall of the vacuum-bonding frame are used for positioning the elastomer valve and prevent its movement when the vacuum syringe is inserted or withdrawn. In its compressed form, positioned in the wall of the vacuum-bonding frame, the elastomer is approximately 0.125 inches. The orifice in the vacuum-bonding frame that provides access to the elastomer valve is approximately 0.094 inches. When the vacuum syringe is inserted into the elastomer valve it punctures the elastomer and accesses the vacuum channel. When the vacuum syringe is withdrawn the compressed elastomer valve collapses on itself thus closing off the vacuum channel to the outside environment. In addition to strengthening the vacuum bond, the single continuous vacuum channel serves two additional purposes. First, it provides a manner of activating the vacuum bond such that equal bonding force is applied to all points of the vacuum-bonding frame simultaneously. This reduces the opportunities for distortion of the pellicle frame or the underlying photomask. Second, it provides a simple nondestructive means of deactivating the vacuum bond. If the frame-supported pellicle needs to be removed, the vacuum locking valve serves as a release valve for introducing air back into the vacuum channel and the frame-supported pellicle is effortlessly disengaged from the photomask. The vacuum bonding frame need only maintain its bonding integrity long enough for the photomask to pass through its "final" through-pellicle" inspection. Referring again to FIG. 4B, afterwards the invention will be permanently bonded to the photomask by activating the locking ring.

The maximum time required for the functioning of the vacuum bond is 72 hours. This requirement includes a large built-in safety margin given the photomask industry's typical manufacturing turn-times (i.e., customer order to product delivery). Approximately 95% of all turn-times range between 18 and 72 hours. From the time that a pellicle is mounted on a photomask to the time that it has completed its "through-pellicle" inspection is usually less than 24 hours and often less than 12 hours. In the case of Application Specific Integrated Circuit (ASIC) devices turns-times can be as short as 18 hours.

Figure 7:
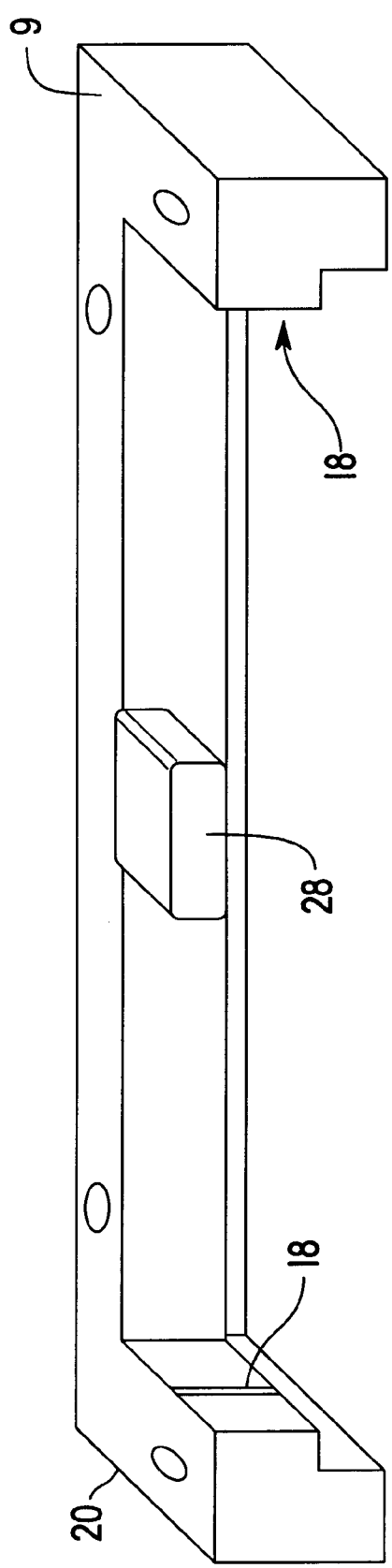
FIG. 7 is a 3-dimensional cross-sectional view of the separate locking ring assembly. The Figure is a 90-degree rotation of FIG. 5 showing the orifice (28) in the assembly used to accommodate the vacuum inlet needle valve.

If and only if, the photomask successfully passes its final "through-pellicle" inspection, will the frame-supported pellicle be permanently bond to the photomask using the locking ring assembly. Referring again to FIG. 4, the locking ring assembly is fitted around the exterior of the vacuum bonding frame in a "frame-within-a-frame" configuration. The locking ring assembly can slide to an "up" position (FIG. 4A) and a "down" position (FIG. 4B) on male tracks (10) molded into the body of the vacuum bonding frame. Corresponding female tracks exist in the inner perimeter of the locking ring assembly (18). The locking ring is preferably composed of the same metal replacement polymer as the vacuum bonding frame and is also preferably manufactured using an injection molding process. On the underside of the locking ring assembly is a pressure-sensitive adhesive (19). Until the pellicle is permanently bonded to the photomask the locking ring assembly is left in its "up" position. Referring now to FIG. 7, an opening (28) is placed in the locking ring assembly for access to the vacuum inlet valve in the vacuum bonding frame and is large enough to accommodate the vertical travel limits of the locking ring assembly. The height of this opening is approximately 0.0625 inches and its with is approximately 0.125 inches. Any position in the elastomer valve punctured by the vacuum syringe is satisfactory for activating the vacuum channel. Referring again to FIG. 4, when the locking ring is applied it is pushed downward using a tool that fits into recessed points in the locking ring itself (20). In its final locked position the locking ring is bonded to both the photomask surface and the vacuum bonded frame creating a continuous and airtight seal. Adhesion between the vacuum bonding frame and the locking ring assembling occurs via an extruded lip on the vacuum bonding frame (21).

If the photomask fails its "through-pellicle" inspection, rather than engaging the locking ring assembly, the frame-supported pellicle is removed from the photomask by introducing air or nitrogen into the inlet valve of the vacuum bonding frame thereby breaking the vacuum seal. Unlike the prior art, the vacuum bonding frame leaves behind no residue that must be clean from the photomask surface, the functional integrity of the frame-supported pellicle is preserved for remounting at a later time, and absolutely no damage occurs to the underlying photomask. The re-useable frame-supported pellicle is stored in a contamination free enclosure, such as a SMIF box, by the photomask manufacturer for later use. The second improvement according to the present invention is to eliminate pattern placement errors in the photomask that are induced by the physical distortions and/or imperfections in flatness of the mounted pellicle frame. In the prior art, these distortions are a function of the pellicle frame material and the corresponding manufacturing process that material demands.

In this invention, anodized aluminum used in the prior art is replaced as the constituent material for the pellicle frame with a semi-crystalline polymer compatible with an injection molding manufacturing process. A preferable material is 30% carbon reinforced Polyetheretherketone (PEEK). PEEK is a popular material in the semiconductor industry due to its unique mechanical, thermal, and chemical characteristics. The 30% carbon reinforced PEEK provides the rigidity (flexural Modulus=1,885,400) and dimensional stability required for the drum-like mounting of the transparent membrane on the pellicle frame. It is resistant to radiation of the wafer exposure tool with no significant reduction in mechanical characteristics. PEEK does not suffer from outgasing that could contaminate the protected pattern area of the photomask. It is available in anti-static or conductive forms for charge dissipation that could otherwise damage the minute photomask features due to capacitive discharge.

Carbon filled PEEK is also black in color to prevent light scattering from the pellicle frame that could compromise pattern transfer during wafer exposure. PEEK is extremely resistant to a wide variety of organic and inorganic chemicals and is resistant to hydrolysis in boiling water and even superheated steam. These characteristics allow PEEK to be thoroughly cleansed of contamination following injection molding and frame assembly so that it is particle free when joined to the transparent membrane for the creation of the frame-supported pellicle product. Finally, PEEK has excellent wear and abrasive resistance with a low coefficient of friction that will prevent particulate shedding during the activation of the locking ring assembling of this invention.

With regards to the pellicle frame manufacturing process, the dimensional tolerances associated with the injection molding process are compatible with the dimensional tolerances of the pellicle frame. The tightest size tolerances for the pellicle frame are 0 to 200 microns for length and width (x and y, axes) and ±250 microns for height (z-axis). Injection molding is easily capable of holding to tolerances of <25 microns. The flatness ratings needed for the pellicle frame's mounting is a function of the flatness specifications of the injection mold. The injection mold will be made from tool steel and lapped to a mirror-like finish. A flatness of 2.5 microns is achievable and will be sufficient for the dual requirements of vacuum bonding the frame to the photomask surface and reducing distortion in the photomask substrate. If better flatness of the pellicle frame were required, this would be accomplished using a supplemental mechanical lapping process of the frame itself The lapping process is an unassisted batch process and relatively inexpensive.

An injection molded pellicle frame made from PEEK will have better dimensional stability and flatness than the prior art employing aluminum shaped with a mechanical milling process. Whereas, the mechanical milling process acts to releases stresses in the metal that result in physical distortions of the pellicle frame, in the injection molding process, the internal material stresses will act to maintain the shape of that molded part.

Alternative Embodiment—Vacuum Frame Only

Figure 8A:
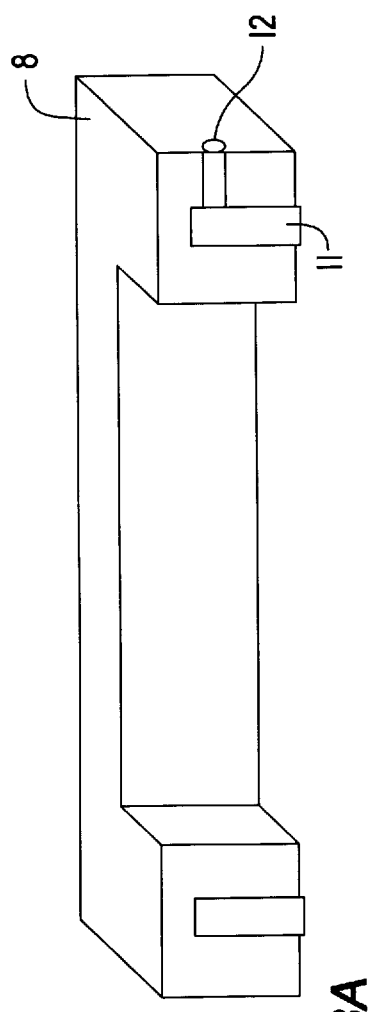
FIG. 8A shows the vacuum bonding frame with the vacuum channel but without the locking ring assembly.

Referring now to FIG. 8A, the locking ring assembly is eliminated from the invention when the vacuum bond can be expected to hold for a year or more. This is entirely conceivable when the frame interface surface is build to the high tolerances specified in the preferred embodiment and there is no out-gassing of the frame material or leaking of the vacuum inlet valve. As an additional assurance that the pellicle would not become dislodged some time later, the end user would be instructed to periodically refresh the vacuum; perhaps every six months of so. It is also possible to embed a desiccant in the vacuum channel of the invention and permanently seal the vacuum inlet valve to prevent vacuum degradation.

Alternative Embodiment—Adhesive Bonding

Referring again to FIG. 8A, permanent bonding of the vacuum bonding frame is achieved by injecting a low viscosity adhesive into the vacuum channel via the vacuum inlet valve (12). The vacuum in the vacuum channel will draw the adhesive into the channel. The adhesive would be one that quickly bonds as it dries (perhaps using a chemical accelerant) or one that uses a UV curing technique. UV activated adhesives have the benefit that they have very low viscosity and produce little out-gassing. The UV activated adhesive would be cured by inserting the vacuum bonded pelliclized photomask into a UV oven flooded with UV radiation. The UV radiation impinging on the underside of the vacuum bonding frame through the transparent quartz substrate will be sufficient to cure the adhesive.

Alternative Embodiment—Eliminate Vacuum Channel

Figure 8B:
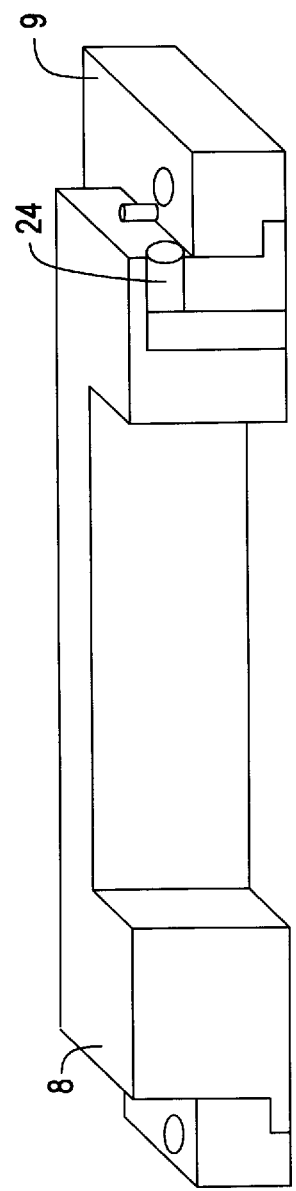
FIG. 8B shows the vacuum bonding frame without the vacuum channel but with the locking ring assembly.

Referring now to FIG. 8B, the vacuum channel is eliminated from the vacuum-bonding frame yet the closely matched vacuum-bonding frame and photomask mating surfaces provide adequate bonding strength. In fact, test trials have demonstrated this to be the case. Activation of the vacuum bond is performed by squeezing the residual air out of the frame-to-photomask interface with the application of a downward force on the vacuum bonding frame. The permanent bonding of the frame to the photomask surface is still achieved using locking ring assembly in the preferred embodiment of this invention. A hole is incorporated into the bulk material of the vacuum-bonding frame that runs from the side of the frame to the mounting surface (24). This hole is attached to an inlet valve. Introducing a brief blast of air into the hole is enough to break the vacuum seal for the easy removal of the frame-supported pellicle from the photomask.

Alternative Embodiment—Flat Surface Vacuum Bonding

Figure 8C:
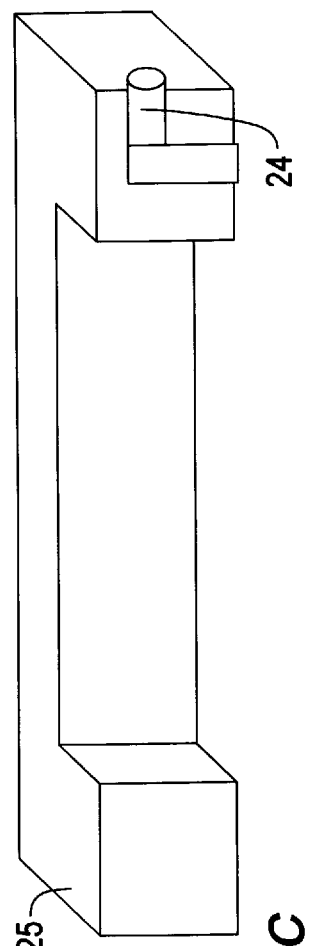
FIG. 8C shows the vacuum bonding frame without both the vacuum channel and the locking ring assembly.

Referring now to FIG. 8C, both the vacuum channel and the locking ring assembly are eliminated by manufacturing the mounting surface of the vacuum bonding frame to the photomask surface with such perfection that the pellicle frame would hold permanently with a single application of down pressure. In this embodiment, the pellicle frame design would be similar to the current (prior art) design with the fundamental difference being the tighter physical tolerances placed on manufacturing in terms of flatness. As in the alternative embodiment "Eliminate Vacuum Channel", a hole and inlet valve (24) would be incorporated into the pellicle frame to assist in dismounting the pellicle.

Alternative Embodiment—Flat Surface Vacuum Bonding with Adhesive Bead

Referring again to FIG. 8C, temporary bonding of the vacuum-bonding frame to the photomask surface is achieved by matching the flatness and surface finish of the mounting surface of the vacuum-bonding frame to that of the photomask surface. Permanent bonding of the vacuum-bonding frame to the photomask is achieved depositing an adhesive bead around the outside perimeter of the vacuum-bonding frame to the photomask surface.

Alternative Embodiment—Multiple Vacuum Channels

Figure 9B:
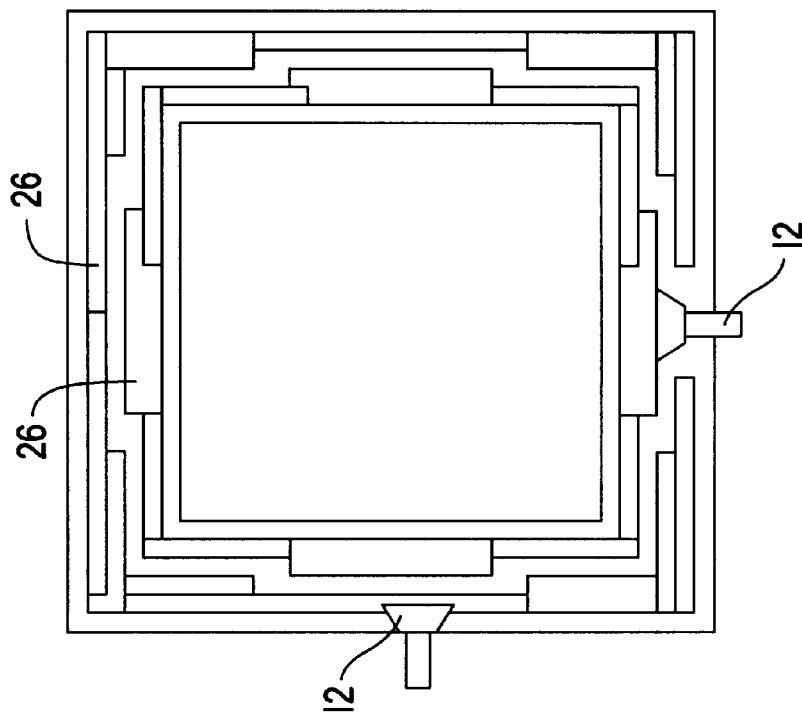
FIG. 9A and FIG. 9B show two different vacuum channel configurations.
Figure 9A:
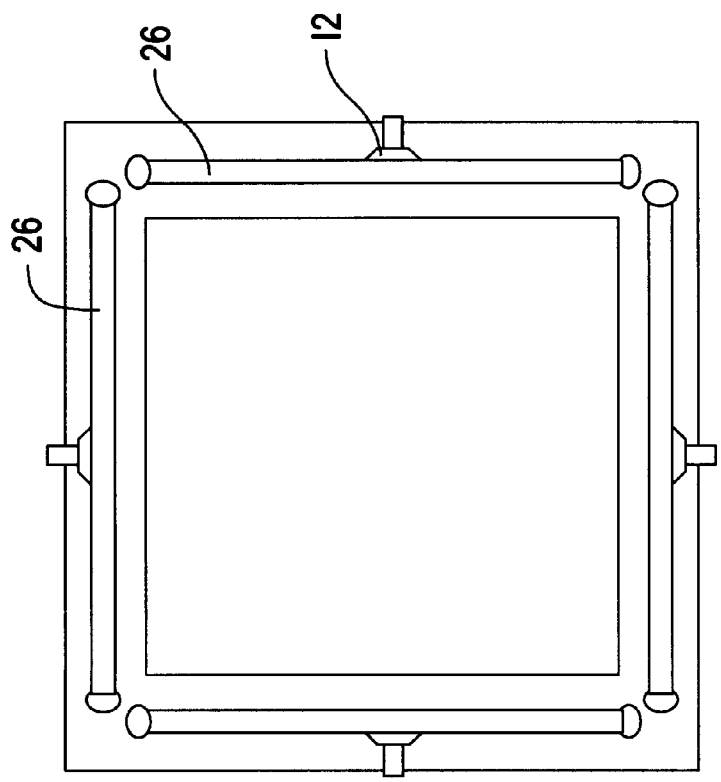

Referring now to FIG. 9a and FIG. 9b, a configuration of multiple independent vacuum channels would replace the single continuous vacuum channel in the preferred embodiment of this invention. The independent vacuum channels (26) would each possess vacuum inlet valves (12). The independent vacuum channels would provide additional control for optimizing the vacuum bonding process by reducing frame and photomask distortion. It would also aid in the permanent bonding of the pellicle by providing a means of eliminating frame slippage during the introduction of adhesive. As adhesive is injected into one vacuum channel, one or more vacuum channels would secure the frame to the photomask.

Alternative Embodiment—Two Step Adhesives

In this embodiment, the industry's current frame design is employed with a new two-step adhesive system coated on the photomask mounting surface of the pellicle frame. The first step provides a low-strength bond which provides a temporary adhesive attachment means to hold the frame to the photomask surface while it makes its way through the final inspection process. This special adhesive would then be made permanent by subsequent second step curing such as with UV radiation or with an accelerator. This second step provides a permanent adhesive attachment means to the frame to the photomask surface. If the photomask were not to pass its final "through-pellicle" inspection, the pellicle would be removed without damage to itself or the photomask due to the weak bonding strength of the uncured adhesive. Enough of the uncured adhesive would remain on the frame mounting surface for the frame-supported pellicle to be reapplied later. Alternately, the adhesive may be re-applied prior to the pellicle's reapplication to the photomask.

Alternative Embodiment—Two Adhesives

In this embodiment, the industry's current frame design is employed with a first, relatively weak adhesive serving as a temporary adhesive attachment means to the frame to the photomask surface while it makes its way through the final inspection process. A second, permanent adhesive is applied following successful inspection to provide a permanent adhesive attachment means for bonding the frame to the photomask surface.

Alternative Embodiment—Current Pellicle Frame

Figure 10:
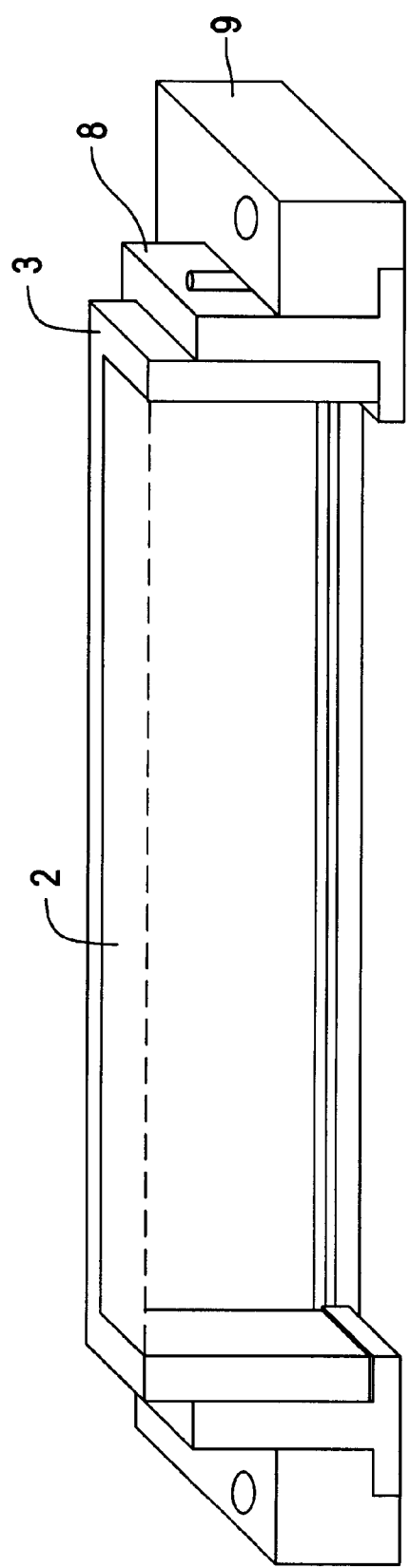
FIG. 10 is a 3-dimensional cross-sectional view of an alternative embodiment of the invention that serves as an adapter for the current pellicle design. The figure shows how the current pellicle design can be mounted in this embodiment of the invention exploit all the functional advantages of the preferred embodiment.

Referring now to FIG. 10, alternative embodiments of this invention discussed thus far have been designed as replacements for the current pellicle frame. In this embodiment, the invention is used in conjunction with the current pellicle frame. The vacuum bonding frame is adapted so that it will accommodate the current pellicle frame bonded to it using the current frame's own pressure-sensitive adhesive. Vacuum bonding of the adaptive unit would be achieved by virtue of the flatness ratings of the vacuum bonding frame with the possible addition of a vacuum channel. This embodiment would also employ the locking ring assembly for permanently bonding the device to the photomask.

Alternative Embodiment—Alternative PEEK Formulation

In the preferred embodiment of this invention, an injection molding process using 30% carbon-filled PEEK was prescribed as the constituent material used to create a pellicle frame with flatness characteristics compatible with the photomask quartz substrate such that no distortions are induced in the photomask. An alternative approach is to employ a different formulation of PEEK (e.g., <30% carbon filled) to create a pellicle frame that is rigid enough to supported the polymeric membrane yet sufficiently flexible to conform to the photomask surface without inducing any distortions in that photomask.

Alternative Embodiment—Alternative Polymer for Frame

Polymers other than PEEK would be used as the constituent material for the invention. These polymers would have the basic characteristics discussed earlier to fulfill the functional requirements of the invention, be compatible with an injection molding manufacturing process, and provide a reduction in manufacturing cost. Possible candidates include Polyester Liquid Crystal Polymer (LCP), Polyetherimid (PEI), Polyphthalamide (PPA), and Polyphenylene Sulfide (PPS).

Alternative Embodiment—Ceramic Frame

A ceramic would serve as the constituent material for the invention together using a casting process for manufacturing. A mechanical lapping process would most likely be used to improve the finish of the mounting surface. A conductive coating would be added to the outside of the ceramic pellicle frame for charge dissipation.

Alternative Embodiment—Metal Frame

A metal such as stainless-steel or a higher grade of aluminum would be employed as the constituent material for the invention. A mechanical milling or die casting process would be used for manufacturing but would be performed to tighter flatness and surface finish specifications than are used in the current art.

Alternative Embodiment—Needle Valve

The elastomer self-locking vacuum inlet valve may be replaced by a conventional needle valve similar in design to those produced by PFTE Kontes and available through VWR Scientific (catalog number: KT82-6500-0004). The dimensions of the needle valve would be reduced for compatibility with the dimensions of the invention and custom manufactured.

What is claimed is:
1. A pellicle support device intended for temporarily securing a frame-supported pellicle on a photomask substrate so that the frame-supported pellicle is reusable, the support device comprised of:
   a polygonal pellicle frame, the frame having a generally rectangular cross section, the cross section including a top pellicle membrane mounting surface such that a polymeric membrane may be placed on the top surface in order to protect the photomask patterned area, a bottom photomask mounting surface, an interior surface, and an exterior surface;
   a temporary adhesive attachment means, such that the temporary adhesive attachment means temporarily binds a portion of the bottom photomask mounting surface of the pellicle frame to a portion of the photomask substrate, and a permanent adhesive attachment means, such that the permanent adhesive attachment means permanently binds the pellicle frame to the photomask substrate.

2. The pellicle support device of claim 1 wherein the temporary adhesive attachment means is a two step adhesive whereby the adhesive is introduced to the pellicle frame and the adhesive provides temporary adhesion of the pellicle frame to the bottom photomask mounting surface and whereby the adhesive can be cured at a later date in order to provide a permanent attachment of the pellicle frame to the photomask substrate.

3. The pellicle support device of claim 2 wherein the permanent adhesive attachment means is a permanent cure of the temporary adhesive attachment means, such that the permanent cure is initiated by ultraviolet light.

4. The pellicle support device of claim 2 wherein the permanent adhesive attachment means is a permanent cure of the temporary adhesive attachment means, such that the permanent cure is initiated by an accelerator.

5. The pellicle support device of claim 1 wherein the temporary adhesive attachment means is a weak adhesive whereby the adhesive is introduced to the pellicle frame and the adhesive provides temporary adhesion of the pellicle frame to the bottom photomask mounting surface.

6. The pellicle support device of claim 5 wherein the permanent adhesive attachment means is a second adhesive.

7. A method of fabrication, inspection, and repair of a pelliclized photomask substrate, the method consisting of creating a photomask pattern on a photomask substrate;

cleaning, inspecting, and repairing the photomask pattern;

temporarily mounting a frame-supported pellicle to the photomask substrate by temporary adhesive attachment means;

performing the following steps as often as necessary:

inspecting the frame-supported pellicle and photomask pattern, removing the pellicle support device, if necessary, cleaning and repairing the photomask pattern, and temporarily remounting the frame-supported pellicle on the photomask substrate by temporary adhesive attachment means; and permanently bonding the frame-supported pellicle to the photomask substrate when through-pellicle inspection is successful.

* * * * *